Feb. 1, 1966 C. F. WHEATLEY, JR 3,233,184

SINGLE ENDED TRANSISTOR AMPLIFIER INCLUDING A BIASING NETWORK WITH CAPACITOR VOLTAGE STABILIZATION

Filed June 19, 1961 2 Sheets-Sheet 1

INVENTOR.
CARL F. WHEATLEY, JR.
BY
Eugene M. Whitacre
ATTORNEY

Feb. 1, 1966 C. F. WHEATLEY, JR 3,233,184

SINGLE ENDED TRANSISTOR AMPLIFIER INCLUDING A BIASING NETWORK WITH CAPACITOR VOLTAGE STABILIZATION

Filed June 19, 1961 2 Sheets-Sheet 2

INVENTOR.
CARL F. WHEATLEY, JR.
BY
Eugene M. Whitacre
ATTORNEY

United States Patent Office 3,233,184

Patented Feb. 1, 1966

3,233,184

SINGLE ENDED TRANSISTOR AMPLIFIER INCLUDING A BIASING NETWORK WITH CAPACITOR VOLTAGE STABILIZATION

Carl F. Wheatley, Jr., South Bound Brook, N.J., assignor to Radio Corporation of America, a corporation of Delaware Filed June 19, 1961, Ser. No. 117,902
20 Claims. (Cl. 330—15)

Figure 1:
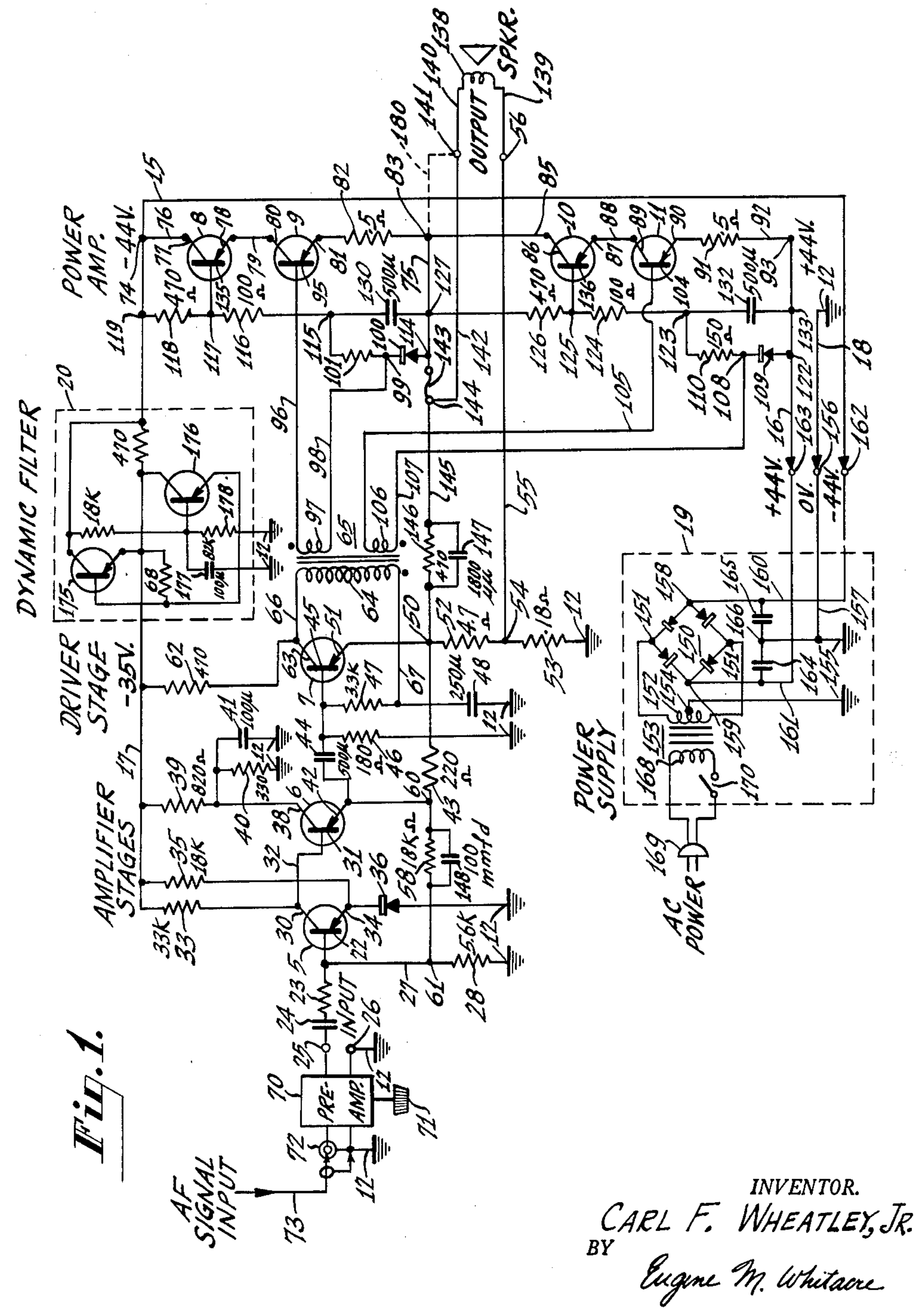

This invention relates to signal amplifiers, and more particularly to transistorized Class B and AB amplifiers. In addition, this invention relates to an integrated electrical circuit including driver, and predriver transistor amplifier stages for a transistorized Class B or AB power amplifier stage.

The advantages of fully transistorized power amplifier equipment for high quality audio-frequency amplification has been considered for some time since such equipment provides the inherent advantages of low heat dissipation requirements, substantially instantaneous operation when turned on, substantial freedom from microphonics, and improved reliability. However, these advantages have been achieved heretofore only at a sacrifice in the performance characteristics of the amplifier, or at significantly higher cost.

The available power output from conventional transistorized push-pull power output stages is limited since this equipment must be designed so that the most severe operating conditions cannot cause the transistor ratings to be exceeded. Otherwise, the transistors are subject to catastrophic failure as a result of thermal runaway. In addition to providing good heat dissipation for the power transistors by means of suitable heat sinks, known types of amplifiers rely on emitter degeneration and reduced supply voltages, which reduce the efficiency of the amplifier and the power output, to guard against thermal runaway. Since in prior push-pull power amplifier circuits all transistors share the load equally, the power output is limited to the power output of one transistor, properly stabilized against thermal runaway, times the number of transistors.

In addition to the foregoing, push-pull power output circuits have the disadvantage that the transistors used therein must meet rather severe requirements of matching beta, linearity, collector-to-emitter breakdown voltage, frequency response, and saturation current. Another disadvantage of prior circuits is the expense that must be taken to insure good power supply filtering so that ripple currents remaining due to the imperfect balance of the circuits do not produce a significant ripple or hum in the output circuit. In this respect, the unbalanced ripple voltage appears in the input circuit of the output stage and is amplified resulting in a significant output. The prior circuits also require a lower voltage and hence more expensive power supply, since the voltage that can be tolerated is limited to the breakdown voltage of the individual transistors used in the circuit.

Accordingly it is an object of this invention to provide an improved transistor amplifier circuit.

Another object of this invention is to provide an improved high power Class B and AB amplifier circuit using transistors.

A further object of this invention is to provide an improved high power transistor amplifier wherein the power output is significantly greater than the power output of a single transistor, properly stabilized against thermal runaway, times the number of transistors.

It is therefore an object of this invention to provide a practical high-performance solid-state audio-frequency signal amplifier which can equal or better the performance of present electron-tube amplifiers available for the same purpose, and wholly without sacrificing performance or increasing the cost of production, while at the same time being much smaller in physical size than corresponding electron tube amplifiers.

It is a further object of this invention to provide an improved transistorized audio-frequency signal amplifier having a power output stage of the single-ended Class B and AB type which provides relatively low distortion, high signal output levels, and is not critical to matching of certain of the transistor amplifier devices therein for proper operation.

Another object of the invention is to provide an improved transistor push-pull power output stage which is substantially insensitive to hum remaining due to unbalance between the halves of the push-pull stage.

In accordance with the invention, the Class B or AB power output stage includes at least two series-coupled transistor devices. Two such Class B or AB stages may be connected with a load, such as a loudspeaker, to provide a form of single ended push-pull amplifier. A signal to be amplified is applied to one of the transistors, which operates in the common emitter mode, and it in turn drives the second transistor of the pair which operates fundamentally as a common base amplifier. A biasing network is provided for applying appropriate base voltages to the two transistors. The biasing network includes voltage stabilizing means, such as a capacitor, so that the voltage distribution along the biasing network will change with signal voltage so that the base-collector voltage of the second transistor may become forward biased, or in other words, so that the second transistor may go into saturation. The biasing network is adjusted so that the second transistor goes into saturation before the first transistor.

The second transistor thus operates essentially as a variable switch, and can be used to deliver considerably more power than the first transistor. The significance of the foregoing is that the first transistor which is stabilized against thermal runaway delivers a given power to the load. However, the second transistor's current is controlled by the first transistor and hence there is no additional thermal runaway problem and the second transistor can deliver more power to the load than the first transistor. It should be noted that the total power delivered to the load is the sum of the power delivered from both transistors.

Since the second transistor operates merely as a switch, there is no requirement for matching that transistor to the first transistor. Furthermore a significant improvement in ripple or hum current is achieved in circuits embodying the invention because the path of the unbalanced ripple current is such that no amplification thereof ensues, thereby permitting the power supply filtering to be less critical. Amplifiers embodying the invention enable the use of much higher supply voltages than with prior push-pull circuits because the two transistors are connected in series and in addition since the second transistor is operated in a common base mode, its collector-to-emitter breakdown voltage is substantially higher than that of a common emitter stage.. These features permit a less expensive high voltage, lower current power supply, better efficiency and inherently lower distortion.

The invention will be further understood from the following description when considered in connection with the accompanying drawings and its scope is pointed out in the appended claims.

Figure 2:
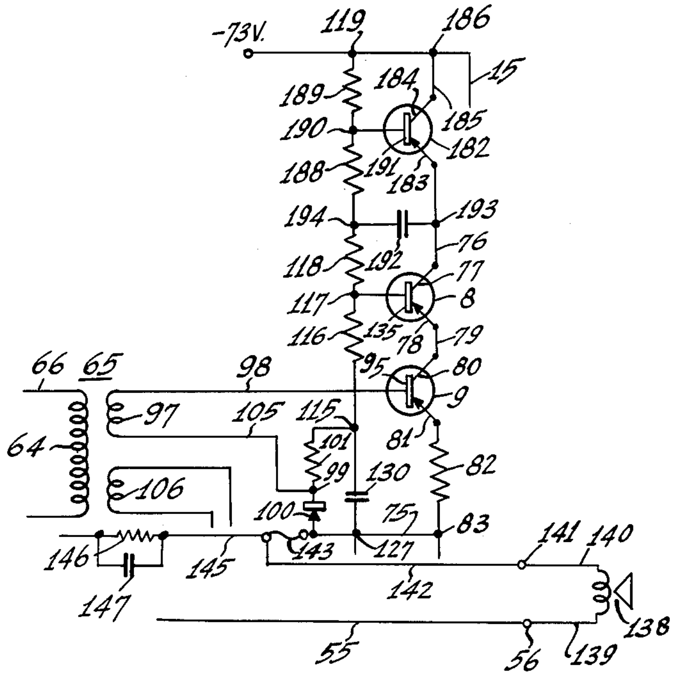

In the drawings,

FIGURE 1 is a schematic circuit diagram of a transistorized audio-frequency signal amplifier system embodying the invention and showing its use for driving a high-power electromechanical signal translating device such as a loudspeaker, and FIGURE 2 is a schematic circuit diagram of a portion of the amplifier system of FIGURE 1, showing a modification thereof in accordance with the invention.

Referring to the drawings and particularly to FIGURE 1, the audio-frequency amplifier shown comprises (1) a pair of input signal amplifier stages which include, as the active amplifier elements or devices thereof, a pair of transistors 5 and 6, (2) a driver stage having a transistor 7 as the active amplifier element or device thereof, and (3) a power amplifier of the single ended push-pull type having a pair of series-connected transistors 8 and 9 in one half thereof and a pair of series-connected transistors 10 and 11 in the other half thereof.

Operating currents and voltages for the transistor elements of the amplifier stages with respect to common ground 12 for the system, are provided at a negative supply lead 15, a positive supply lead 16, and a second negative supply lead 17. In the present example, the negative supply lead 15 may be considered to operate at substantially −44 volts, the supply lead 16 at +44 volts and the supply lead 17 at −35 volts, all with respect to ground 12 for the system and a common ground supply lead 18. To receive these operating voltages the supply leads 15, 16 and 18 are connected with a suitable power supply unit 19 as will hereinafter be described and the negative supply lead 17 is connected with the negative supply lead 15 through a suitable dynamic filter network 20, also as will hereinafter be described.

In the present example, it will be noted that the input terminals 25–26 for the amplifier are connected with a signal preamplifier 70 forming part of a receiver, phonograph or other apparatus with which the amplifier is used, and having the usual controls including a volume control element indicated at 71, for controlling the signal input level. The preamplifier is provided with a shielded input terminal 72 connected to chassis ground and adapted to be connected with a shielded input conductor or line 73 from any suitable source of signals.

Signals from the input terminal 25 are applied to the base 22 of the first stage transistor 5, which is shown as a PNP germanium transistor, through a series circuit including an input resistor 23 and an input coupling capacitor 24. The base 22 is also connected to common ground 12 through a lead 27 and a base resistor 28.

The collector 30 of the first stage transistor 5 is directly coupled to the base 31 of the second stage transistor 6 through a conductor 32 across the impedance of a collector coupling resistor 33 which is connected between the collector 30 and the negative supply lead 17. The emitter 34 is provided with an emitter biasing connection to common ground 12 through a voltage stabilizing diode 36, which in the present instance is a silicon diode. The diode 36 is connected in series with the emitter current path of the transistor 5, and, its particular forward biased operating point is set by the resistor 35 which is connected between the cathode of the diode 36 and the negative lead 17.

The collector 38 of the second stage transistor 6 is connected to the negative supply lead 17 through a collector resistor 39 and, to set the proper voltage on the collector, a bleeder resistor 40 is connected between the collector and common ground in parallel with a filter capacitor 41. In this case the second stage transistor 6 operates as an emitter follower, and the signal output is taken from the emitter 42 through a coupling connection including a coupling capacitor 44 between the emitter 42 and the base 45 of the driver stage transistor 7.

A feedback path is provided between the emitter 42 of the second amplifier stage and the base 22 of the first stage. The feedback path includes a resistor 58 connected between the emitter end of the resistor 43 at a terminal 60 and a terminal 61 on the lead 27 connected to the base 22. In this regard it will be noted that the bias voltage at the base 22 of the transistor 5 is determined by the voltage at the emitter 42 of the transistor 6 and the relative values of the resistors 28 and 58. A capacitor 148 is connected in parallel with the resistor 58 to provide phase correction of high frequencies for optimum high frequency response. The operating point of both the first and second stage amplifiers are made exceptionally stable by the inclusion of the diode 36 in the emitter circuit of the first stage transistor 5 so that a relatively large amount of D.C. loop feedback may be applied through the resistor 58. The stability is important to maintain the optimum operating point for the transistors 5 and 6 and thereby insure low distortion from the predriver or amplifier stages in a power amplifier of this type.

A feature of this invention is that the second stage amplifier 6 is coupled to the driver transistor 7 with a bootstrap arrangement in order to reduce the A.-C. loading on, and hence the distortion produced by the second stage amplifier 6. As mentioned above, the emitter 42 of the transistor 6 is coupled to the base 45 of the driver transistor 7 through a coupling capacitor 44. Audio signals are developed across a base resistor 46 connected between the base 45 and ground 12.

The emitter resistor 43 is connected between the emitter 42 and a terminal 50 which is connected with the emitter 51 of the driver stage transistor 7 and with a pair of series connected emitter circuit feedback resistors 52 and 53 of low resistance, the latter being connected to common ground 12. In the bootstrap arrangement, the signal voltage at both ends of the resistor 43 vary in the same sense, hence resulting in low signal current flow therethrough. This is because the voltage at the emitter 42 tends to vary with signal, and in like manner the emitter 51 voltage of the transistor 7 also varies with signal in the same sense and at about the same amplitude level with respect to ground due to the high degree of negative feedback applied to the emitter of transistor 7 from succeeding stages. This circuit arrangement provides the advantages of permitting a relatively high D.-C. current through the resistor 43 without requiring additional signal or A.-C. current from the transistor 6. The net result of the foregoing is that the transistor 6 draws less signal current thereby permitting a greater gain, and increased linearity.

The output circuit for the driver stage includes a load resistor 62 connected between the collector 63 and the negative supply lead 17. Across the impedance of the resistor 62 is connected the primary winding 64 of an output coupling or driver transformer 65. The high signal potential end of the primary winding 64 is connected with the collector 63 through a lead 66 and the low potential end of the primary winding 64 is connected through a lead 67 to chassis ground through a signal bypass capacitor 48. Thus no appreciable D.-C. current flows through the primary winding 64 to cause distortion due to partial saturation of the core of the transformer 65.

The large D.-C. load resistor 62 in the collector circuit of the transistor 7 provides operating point stability through collector-to-base feedback biasing, eliminating the need for a large bypassed emitter resistor and its associated low frequency phase shift. The D.-C. feedback is provided through a resistor 47 which is connected between the low signal potential end of the primary winding 64 and the base 45.

Since the collector current of the transistor 7 flows through the resistor 62, the D.-C. voltage at the collector 63 reflects any changes in this current flow which might be caused by temperature change or the like. The bias connections through the resistors 46 and 47 tends to maintain the transistor operating current constant, thereby providing D.-C. stabilization. This circuit is another feature of the present invention in that the number of components required for D.-C. stabilization is less than that required for prior circuits. In prior circuits, a pair of series resistors, and an intermediate shunt capacitor is connected between the collector and base of a transistor for D.-C. stabilization. The capacitor, of course, provides a signal bypass to prevent A.-C. degeneration. In the present circuit, the D.-C. blocking capacitor ordinarily connected between the collector and the output transformer in prior circuits, is connected between the low signal potential side of the output transformer and ground and doubles as the signal bypass capacitor in the D.-C. feedback circuit. This connection thus requires one less resistor and one less capacitor than prior circuits.

The low-frequency distortion is greatly reduced in the driver stage circuit by the R-C coupling of the driver transformer primary 64 to the collector 63 of the driver stage transistor 7, thereby eliminating the D.-C. flux unbalance in the transformer core. Thus the driver transformer 65 is not an appreciable limiting factor relative to low frequencies in the design of the high performance amplifier shown because there is no D.-C. flux unbalance to limit the low frequency response and linearity. By way of example, the leakage inductances in the transformer shown is minimized by "pentafilar" winding wherein five conductors are random-wound on a form and three of the conductors are connected in series to make up the primary and the other two form the two secondaries.

The output transformer is another feature of this invention. In the past, the two secondary windings were wound bifilar, thereby providing tight coupling between the secondary windings. However this construction results in loose coupling between the primary windings and the secondary windings. This results in high leakage inductance and hence adversely affecting the high frequency performance of the system.

The coupling transformer 65 of the invention includes a nylon bobbin with end portions included to prevent the windings from slipping off. With such a bobbin the three primary conductors (using No. 30 wire for example) and the two secondary conductors (using No. 26 wire for example) may be simultaneously wound to provide a "sentafilar" windings as noted above.

Thus the driver transformer 65 is not an appreciable limiting factor relative to high frequencies in the design of the high performance amplifier shown because there is a very tight coupling and low leakage inductance between primary and both secondaries.

To achieve extremely low distortion before feedback, the driver stage is designed to provide many times the power normally required to drive the output stage to full output power.

The power amplifier or output stage is of the single-ended push-pull type, one half of the amplifier circuit including the transistor amplifier devices 8 and 9 and the other half of the amplifier circuit including the transistor amplifier devices 10 and 11. The collector-to-emitter current path of each pair of amplifier devices and the load, such as the loudspeaker is connected in series. Since both halves of the push-pull power amplifier are identical, only the top amplifier portion will be described in detail.

With respect to the transistors 8 and 9, the collector-emitter series current path may be traced from the negative supply conductor 15 at a terminal 74 thereon through a circuit lead 76 to the collector 77 of the transistor 8, and from the emitter 78 thereof through a connection lead 79 to the collector 80 of the transistor 9. Thence, the series connection can be traced from the emitter 81 of the transistor 9 through a series limiting resistor 82 to the lead 75 at a terminal 83. From the terminal 83, the series circuit continues through the loudspeaker, the emitter resistor 53 of the driver amplifier stage 7, ground and the power supply back to the collector 77 of the transistor 8.

The base 95 of the transistor 9 is connected through a signal supply lead 96 with one secondary winding 97 of the coupling transformer 65, and this in turn is connected through a bias supply lead 98 with a terminal 99 which is the junction of a series connection of a diode 100 and a resistor 101, the diode being poled with respect to the conductor 75 and the resistor 101 to receive a forward bias.

The diode 100 and the resistor 101 are effectively part of a series string of voltage divider elements or resistors substantially paralleling the series collector-emitter circuit connection of the transistors 8 and 9 between the negative supply lead 15 and the conductor 75. The voltage divider circuit or network may be traced from the terminal 114 on the conductor 75 through the diode 100 and the resistor 101 to a terminal 115. The path then continues through a resistor 116 to a terminal 117, and from the latter through a series resistor element 118 to a terminal 119 on the supply lead 15.

A bypass capacitor 130 is connected between the conductor 75 and the terminal 115 which is between the resistor elements 101 and 116 on the voltage divider network in the present example. The capacitor is connected in shunt with a portion of the divider network as is determined by certain consideration which will be discussed hereinafter.

The second transistor of each half of the push-pull circuit, that is, the transistors 8 and 10, are provided with a base connection with a voltage-divider network in each half of the circuit. To this end the base 135 of the transistor 8 is connected directly to the terminal 117 which is a tap point between the resistor elements 116 and 118.

Power output from the push-pull amplifier circuit is applied to a loudspeaker 138 connected between the conductor 75 and the terminal 54 between the emitter resistors 52 and 53 of the transistor 7. One supply lead 139 of the speaker is connected through the output terminal 56 to the junction of the emitter resistors 52 and 53 of the driver transistor 7. The opposite supply lead 140 of the speaker is connected to the output terminal 141, which in turn is connected through a lead 142 and a fuse 143 to the terminal 114 on the conductor 75. It will be noted that an output terminal 144 of the fuse 143 is also connected with the feedback lead 145 and the series feedback control resistor 146 therein to the terminal 50, on the emitter circuit resistor network 52–53 to ground 12. The feedback resistor 146 is provided with a "speed-up" bypass capacitor 147, which is connected in parallel with the resistor 146 to provide phase correction at high frequencies for optimum high frequency response.

The output circuit through the speaker 138 may be traced through the resistor 53 to common ground 12. This places a feedback voltage proportional to the current through the speaker across the resistor 53 in the emitter circuit of the driver stage. At the same time, voltage feedback, proportional to the voltage across the speaker 138, is provided from the terminal 144 through the feedback resistor 146 to the series-connected resistors 52 and 53 in the emitter circuit of the driver stage. These are relatively low resistance elements and may be considered in the present example to be of a value of 4.7 ohms for the resistor element 52 and substantially .18 ohm for the resistor element 53. Other values of resistor elements in the circuit may be referred to by way of example only, and include a value of substantially 470 ohms for each of the resistors 118 and 126, 100 ohms for each of the resistors 116 and 124, and a value of 150 ohms for each of the resistors 101 and 110. The resistors 82 and 91 may be considered to have a value of substantially 0.5 ohm each, the capacitors 130 and 132 have a value of 500 $\mu$f. at 15 v., and certain other values are indicated in the circuit diagram.

The power supply means for the system may be of any suitable type providing adequate regulation. The power supply unit 19 consists of a center-tapped, full-wave rectifier bridge 150 having input terminals 151 connected with the ends of the secondary winding 152 of a power supply transformer 153, the center tap 154 of which is connected to chassis ground 155 for the unit. This ground, in turn, is connected to a zero-voltage output terminal 156 for the unit through a supply lead 157. The bridge output terminals 158 and 159 are connected through conductors 160 and 161 with output terminals 162 and 163 respectively, for the unit. Filter capacitors 164 and 165 are connected serially between the leads 160 and 161, with the capacitor junction 166 connected to ground 155 for the unit.

The power transformer 153 is provided with an input or primary winding 168 which is adapted to be connected to the usual electrical wall outlet power supply means (not shown) through a suitable plug connector 169 connected therewith. Energization of the power supply unit is provided through a control switch 170 in this connection. The supply leads 15, 16 and 18 for the amplifier are connected with the terminal 162, 163 and 156 respectively for receiving the power supply voltages therefrom.

The full-wave bridge with capacitive input filter provides a symmetrical plus and minus operating voltage or current supply means for the amplifier system. It may be noted that the secondary winding 152 of the supply transformer is preferably bifilar wound to eliminate any 60 cycle square wave caused by nonlinearity in the iron of the core.

The coupling and filtering of the power supply for the driver stages 5, 6 and 7 is accomplished by the dynamic filter 20 which comprises two transistors 175 and 176 and a filter capacitor 177 as the main elements thereof, the filter capacitor being provided with a shunt load resistor 178, and both being connected to system ground for the amplifier system. In the present example, the unit is built into or incorporated in the system and connected between the negative supply leads 15 and 17. Since transistorized dynamic filters of this type are known and since the filter circuit shown is only by way of example and is not part of the present invention, further description is believed to be unnecessary. In the present system, as desired for operation, the filter may be considered to have an effective time constant of substantially two seconds and to provide better than 66 db of filtering. Since this is a single time constant, the phase shift of low frequency signals fed back via the conductors 15 and 17 through the dynamic filter 20 is limited to 90°, thereby reducing any tendency toward motor-boating. The long time constant causes all of the low level stages to turn on slowly thereby substantially eliminating an objectionable turn on transient.

Because of the high power capabilities of the amplifier at very low frequencies, the loudspeaker or output device 138 may be protected by a fuse such as the fuse 143. This is chosen to limit the power delivered to the speaker to its power rating. The use of the fuse in series with the high output impedance of the output stage and inside the voltages feedback loop insures that no distortion will be added due to the nonlinearity of the fuse. Otherwise, the output terminal 141 could be connected directly to the conductor 75, for example at the terminal 83, through a connection indicated by the dotted line 180.

About 35 db of feedback is used around the two final stages. Combined current and voltage feedback through the leads 55 and 145 from the push-pull output stage to the emitter resistors 52–53, is used to provide a unity damping factor on the lead which can be varied from 0.2 to 5 by changing the resistors 52 and 53 and 146 and the capacitor 147. The total power gain of the driver and power output stages is substantially 40 db in the present example. It may be noted also that the predriver stages provided by the transistors 5 and 6 have about 30 db of voltage feedback through the resistor 58 and capacitor 148 to the first base 22 and a total net signal gain of substantially 30 db. The feedback loop for the predriver stages 5 and 6 is essentially independent of the feedback loops from the power amplifier stage to the driver stage transistor 7.

In considering the operation of the single-ended push-pull amplifier of the invention attention is directed first to the biasing circuit which permits both transistors 8 and 9 to go into saturation for large signal excursions. To this end, a forward bias of about 0.25 volt for the base 95 and emitter 81 electrodes of the transistor 9 is developed across the germanium diode 100. A voltage of about —15 volts appearing at the terminal 117 is applied to the base 135 of the transistor 8, and a voltage of about —9 volts appears at the terminal 115. These voltages are referenced to ground under no signal conditions. Under the no signal conditions the conductor 75 is essentially at ground potential so the —9 volts at the terminal 115 appears directly across the capacitor 130.

When a signal voltage applied to the transistor 9 swings in the direction to cause this transistor to conduct current, the resultant collector current flows through the transistor 8 and the speaker 138. To deliver appreciable output power, the transistors 8 and 9 must go into saturation. To drive the transistor 8 into saturation means must be provided to establish a large emitter 78-base 135 current when the collector 77-base 135 voltage is substantially zero. Without the capacitor 130, it is inconsistent to have a large base 135 current flow and zero voltage between the collector 77 and base 135, or across resistor 118. In other words without the capacitor 130 the transistor 8 can never get into saturation. This situation is obviated in accordance with the invention by the use of voltage stabilizing means connected to the voltage divider string. The voltage stabilizing means in this instance comprises the capacitor 130. As mentioned above the current through the transistors 8 and 9 also flows through the speaker 138. This causes the conductor 75 to become negative with respect to ground. The voltage at the terminal 115 is equal to the sum of the negative voltages on the conductor 75 and across the capacitor 130. At some point during the signal wave cycle, the negative voltage at the terminal 115 with respect to ground will exceed the negative voltage at the terminal 119 which is fixed at —44 volts. The current in the voltage divider will then be redistributed so that additional base 135 current for saturation will flow toward the terminal 115 through the resistor 116, and hence will not be in a direction to increase or sustain the reverse collector 77-base 135 voltage. Under these conditions the terminal 117 may be slightly more negative than the —44 volts at the terminal 119, so that the base 135-collector 77 junction becomes forward biased, thereby permitting the transistor 8 to go into saturation.

The particular voltage point on the voltage divider string to which the capacitor is connected is not critical, and may be varied by adjusting the relative values of the resistors 101, 116 and 118, or by adding additional resistors. As one extreme, if the capacitor 130 is connected to too low a quiescent voltage point on the voltage divider, the sum of the voltages appearing on the conductor 75 and across the capacitor 130 will never exceed the —44 volts at the terminal 119. At the extreme, the capacitor can be connected to points approaching the potential of the terminal 119, so long as there is sufficient isolation to prevent the capacitor from shunting signal energy from the speaker 138. In this regard the capacitor must also be isolated from the base 135 of the transistor 8 to prevent the capacitor from discharging when the transistor 8 goes into saturation. In addition to the foregoing, optimum operation is effected when the transistor 8 goes into saturation prior to the transistor 9. This may be achieved by designing the voltage divider network so that the terminal 115 voltage at the time of saturation is sufficiently more negative than the voltage at terminal 119 to accommodate the base 135 current from the transistor 8 through the resistor 116 required for saturation. This voltage must be selected to accommodate the maximum base 135 current for saturation for the lowest expected beta of the transistors used for the transistor 8 and for the highest frequencies at which saturation is desired.

The other half of the push-pull power amplifier including the transistors 10 and 11 operates in the manner described above. Signals are applied to the two halves of the output stage in push-pull so that one half including the transistors 8 and 9 conducts when the other half including transistors 10 and 11 are cut-off and vice versa.

The transistor 9 is stabilized against thermal runaway by insuring that the resistance in the base bias network which includes the dynamic resistance of the diode 100, the D.-C. resistance of the secondary winding 97 and base resistance of the transistor is low with respect to the beta ($\alpha_{fe}$) of the transistors times the emitter resistor 82. In addition thermal stabilization is provided by the forward biased diode 100. The transistor 11 is stabilized in the same manner.

In addition to temperature stabilization, the diode 100 provides voltage stabilization for the transistor 9. This is desirable because the voltage at the terminal 115 reduces under strong signal and varies under low frequency signal conditions. Either of the above mentioned variations would cause cross-over distortion unless greatly suppressed, as is done by the diode 100. The foregoing is also true with respect to the diode 109 and transistor 11.

Since the transistors 8 and 10 are controlled from a high impedance emitter current source (the transistors 9 and 11), thermal stability thereof is not critical. Of the four transistors in the power output stage, only two need to be stabilized against thermal runaway.

In addition to the foregoing, the fact that the transistors 8 and 10 are driven from a high impedance limiter current source obviates the necessity of critical control of beta linearity, beta matching and beta frequency response. In other words, the currents that flow through the transistors 8 and 10 are controlled by the characteristics of the transistors 9 and 11 respectively. In this respect the transistors 9 and 11 should be matched in the foregoing respects as is conventional for all transistors of known push-pull or bridge power amplifier circuits.

A higher supply voltage may be used with the power amplifier of the invention than with other known types of Class B or AB circuits. This is because the two transistors 8–9 and 10–11 are connected in series. In addition the collector 77-emitter 78 breakdown voltage of the transistor 8 which is operated in the common base mode, is higher than that of a common emitter stage such as transistor 9. The higher voltage power supply has the advantage that for a given power less current is drawn thereby permitting the use of less expensive lower valued electrolytic capacitors. In addition the disortion is lowered because for a given power the current swing will be less thereby avoiding problems associated with driving the transistors into nonlinear operating regions.

This leads to another important advantage of the present invention. The higher breakdown voltage between emitter 78-collector 77 of transistor 8 coupled with the greater thermal stability of the transistor 8 with respect to the transistor 9, permits a greater power output to be delivered to the speaker 138 from the transistor 8 than is the case with the transistor 9. For example, in the amplifier circuit of FIGURE 1, which is capable of delivering in excess of 50 watts with distortions of less than 0.1%, the transistors 8 and 10 deliver approximately 35 watts while the transistors 9 and 11 deliver approximately 15 watts. To highlight the advantage of the latter feature, it should be noted that in prior circuits the power output from each transistor is equal, and limited by the requirements for thermal stability and collector-to-emitter breakdown voltage.

Power supply filtering must be reasonably good for conventional push-pull output circuits to reduce ripple currents in the D.-C. supply because of imperfect cancellation of ripple currents in the output circuit. In the present circuit the problems of ripple currents in the D.-C. supplies are greatly reduced so that the power filtering is less critical and a simplified unit such as shown at 19 may be used effectively. It will be seen that the high output impedance of the common base connection of the second transistors 8 and 10 in the output stage limits to a very small value the ripple current through the signal path provided thereby. No ripple voltages are applied to the bases that can be amplified with the signal. In other words, the high impedance in the emitter of the second transistors 8 and 10, which is the output impedance of the driver transistors 9 and 11, keeps any ripple component that appears on the base of the transistors 8 and 10 from being amplified. No ripple components appear on the bases of the driver transistors 9 and 11 due to the bypassing action of the capacitors 130 and 132. The only ripple currents flowing in the speaker 138, are the unbalanced portions thereof flowing through the voltage divider networks and through the voltage stabilizing capacitors 130 and 132. The resistance of the voltage divider networks is high relative to that of the speaker 138 so that the unbalanced ripple component, which is small initially, is still further attenuated. Additional ripple suppression is obtained as a result of the current and voltage feedback to the driver transistor 7. In the amplifier shown the ripple output is 100 db below the 50 watt output level.

Referring to FIGURE 2 the output or power amplifier circuit of FIGURE 1 may be modified for higher power output by connecting additional transistor amplifier devices in the series coupled transistor network in each half of the amplifier output stage as shown. In this figure a portion of the output stage containing the transistor amplifiers 8 and 9 is shown, and the same reference numerals refer to like elements as in FIGURE 1 and the operation thereof is the same.

In this modification, a third transistor 182 is connected between the negative power supply lead 15 and the second transistor 8. The third transistor 182 has an emitter electrode 183 connected through the lead 76 with the collector 77 of the transistor 8, and has a collector 184 connected through a lead 185 with the negative supply lead 15 at a terminal 186. The series transistor collector-emitter circuit or network is thus extended to include the three transistors 9, 8 and 182 serially between the terminals 83 and 186.

In a similar manner by inserting additional elements, the series resistor voltage-divider network is likewise extended, so that the resistor 118 is connected to the negative supply lead 15 at the terminal 119 through a pair of series-connected resistor elements 188 and 189, with an intermediate junction terminal 190 therefor connected directly to the base 191 of the added transistor 182. The resistor values in the network are adjusted to establish proper bias potential on the base 191. A second stabilizing capacitor 192, corresponding to the capacitor 130, is connected between a reference potential point such as a terminal 193 on the conductor 76 between the collector 77 and the emitter 183 and a tap point 194 on the bias resistor network presently shown between the resistor 118 and 188, to permit the transistor 182 to go into saturation in the same manner that the capacitor 130 permits the transistor 8 to saturate. The operating control provided for the transistors 8, 182 are such that they both reach saturation before the transistor 9. Both transistors 182 and 8 therefore operate as driven transistors successively from the transistor 9 which, in turn, is driven by the signal from the secondary 97 of the driver transformer 65. As in FIGURE 1, the opposite half of the output amplifier circuit may be constructed in the same manner as shown and connected for signal input to the secondary 106 of the driver transformer 65 substantially as shown in FIGURE 1, with the addition of a third transistor as shown in FIGURE 2, to improve the power output of the system without introducing the operational difficulties referred to such as mismatching, thermal runaway, distortion and the like. The addition of a single transistor, two low cost resistors and a capacitor for each half of the push-pull circuit together with a slight increase in the voltage of the power supply is all that is required for adding appreciably to the power handling capabilities of the power amplifier by this means.

From the foregoing considerations it will be seen that an improved power amplifier which gives ultrahigh performance with transistors may be provided in a relatively low-cost circuit configuration and operates to provide low signal distortion, high output signal levels, less critical power supply filtering and improved ripple component suppression. The amplifier is substantially noncritical to matching of the driven power amplifier devices in the output stages, and may be stabilized against thermal runaway in a more economical manner than known heretofore. The output transistors may be of the so called drift-field power type and amplifier frequency response therewith has been attained substantially flat to 90 kc., and only 3 db down at 100 kc. These amplifier devices provide a high current gain which is linear to relative high values making it highly practical to use the direct coupling to a low-impedance load means, such as the speaker shown, without the need of an output transformer.

What is claimed is:

1. A signal amplifier having a power amplifier output stage comprising in combination, two series coupled transistor devices, a first of said devices connected for operating in a common-emitter mode as a driven signal input element thereof and a second of said devices connected for operating in the common-base mode in driven signal-translating connection from the first transistor device, a common signal output load circuit connected in series coupling relation with said transistor devices, means providing a series-resistor voltage divider biasing network for said transistor devices connected for applying operating base voltages thereto, and voltage stabilizing means including a diode in series with said voltage divider biasing network and capacitor means connected in shunt with at least a portion of said biasing network for controlling the voltage distribution along said network to drive the second and then the first device successively into saturation for maximum power output to said load circuit in response to high-amplitude applied signals.

2. A power amplifier as defined in claim 1, wherein a third transistor device is included in series coupled relation to the second transistor device to be driven thereby in the common-base mode and having an operating-voltage base connection with said biasing network, and wherein a second voltage-stabilizing capacitor is connected between a point on said biasing network and a point between said second and third series coupled transistors for further controlling the voltage distribution along said network in response to variations in the amplitude of an applied signal whereby the base-collector voltage of the third transistor device is forward biased for operation into saturation preceding saturation of the second transistor device.

3. A signal power amplifier comprising in combination, two series-coupled transistor devices, a first of said devices connected for operating in a common-emitter mode and having a base input circuit, a second of said devices connected for operating in the common-base mode in driven signal translating connection from said first transistor device through series coupling therewith, a load circuit, common circuit means series coupling said transistor devices with said load circuit, means for applying a signal to the first of said devices through said input circuit thereby to drive said device as a common-emitter amplifier and the second transistor device serially therefrom as a common-base amplifier, means providing a biasing network for said transistor devices for applying operating base voltages thereto, and voltage stabilizing means in said network including a shunt capacitor connected between spaced voltage control points on said network for changing the voltage distribution along the network with signal voltage variation and for forward biasing the base-collector voltage of the second transistor device for operation thereof into full current saturation and maximum power output to said load circuit, in response to high amplitude applied signals at the input circuit of the first transistor device.

4. A single-ended transistorized power amplifier comprising in combination, at least two transistor devices each having a base, an emitter and a collector, means providing an output load circuit for said amplifier, a source of operating current for said amplifier, means providing a circuit connection series-coupling said transistor devices collector-to-emitter with said load circuit and said operating current supply source, means for applying an input signal to the base of a first of said transistor devices for operation in a common-emitter mode and thereby to drive the second of said transistor devices through the series-coupling circuit from collector to emitter in a common-base mode, and means providing a biasing network for said transistor devices connected for applying base operating voltages thereto and including a voltage-stabilizing capacitor connected between spaced points thereon for effecting a voltage distribution along said network variable with signal voltage variation to affect forward-bias operation of said second transistor device into saturation in response to an applied signal of relatively high amplitude.

5. In a transistorized signal amplifier system, the combination of a driver stage having a single transistor amplifier device connected for base-input common-emitter operation and having an emitter circuit including emitter-resistor means of relatively low resistance connected to common ground for said system, a single-ended power amplifier stage comprising at least two power transistor devices each having a base, an emitter and a collector, said power amplifier stage having a common high-signal-potential output conductor, means providing a low impedance output load circuit for said amplifier system connected on the low signal-potential side thereof to common ground for said system through said driver stage emitter circuit resistor means and connected on the high signal-potential side thereof to said common high signal potential output conductor, means providing a circuit connection series coupling said transistor devices collector-to-emitter between said common output conductor and common ground, operating current supply means in said connection to ground, driver transformer coupling means connected between said stages for applying an input signal from the driver stage to the base of a first of said power transistor devices for operation in a common-emitter mode and thereby to drive the second of said power transistor devices through the series coupling circuit from collector to emitter in a common-base mode, means providing voltage feedback coupling from said common high-signal-potential output conductor to the emitter circuit of the driver stage, means providing a series-resistor biasing network for said power transistor devices connected for applying base operating voltages thereto, and voltage stabilizing diode and capacitor means connected in said biasing network for effecting thermal stabilization of the first transistor device and for controlling the voltage distribution along said network to drive the second and the first power transistor devices successively into saturation for maximum power output to said load circuit in response to high-amplitude applied signals.

6. In a signal translating system, a transistorized power amplifier comprising at least two transistor devices each having base, collector and emitter electrodes and being directly series coupled collector-to-emitter from a first to a second of said devices, means providing a low impedance signal output circuit connected with said series coupled devices for receiving output signals therefrom in series relation, means for applying operating current to said series-coupled and connected transistors and load circuit, means providing an input circuit for applying signals to be amplified directly to the base of the first transistor device, means for controlling the operation of said first transistor device as a linearly-controlled common-emitter amplifier to drive the second transistor device as a common-base amplifier and into current saturation in advance of said first transistor device for increased power output, means providing a series-resistance biasing network connected for applying operational base voltages to said devices, and voltage-stabilizing and control means in said network including a control diode serially therein and a control capacitor in shunt relation to a portion thereof, whereby the voltage distribution along the network varies in response to a variation in signal amplitude to effect forward bias of the base-collector voltage of said second transistor device and current saturation for both of said transistors, said network being adjusted whereby the second transistor goes into saturation in advance of the first transistor and whereby the first transistor is effective to deliver a given power to the load and the second transistor delivers substantially more than twice as much power thereto as the first transistor.

7. A transistorized signal amplifier comprising first and second amplifier stages coupled in cascade having a diode-stabilized emitter circuit in the first stage and an emitter circuit in the second stage feedback-coupled to the first stage, a driver stage coupled to said second stage and having an emitter circuit including emitter resistor elements connected to system ground and providing a series connection thereto from the second stage emitter circuit, and a power amplifier output stage coupled to said driver stage and having at least two series coupled transistor devices, a first of said devices connected for operating in a common-emitter mode as a driven signal input element thereof and a second of said devices connected for operating in the common-base mode in driven signal-translating connection from the first transistor device, a common signal output load circuit connected in series coupling relation with said transistor devices and the driver stage emitter circuit for current and voltage feedback thereto, means providing a series-resistor voltage divider biasing network for said transistor devices connected for applying operating base voltages thereto, and voltage stabilizing means including diode means in series with said voltage divider biasing network and capacitor means connected in shunt with at least a portion of said biasing network for controlling the voltage distribution along said network to drive the second and the first device successively into saturation for maximum power output to said load circuit in response to high-amplitude applied signals.

8. In a signal translating system, the combination of a two-stage transistor amplifier and a driver amplifier stage both coupled in cascade relation to a single-ended Class B type transistor power amplifier, said two-stage amplifier having a diode-stabilized emitter circuit in a first stage and an emitter circuit in a second stage feedback-coupled to said first stage and said driver stage having an emitter circuit including emitter resistor elements connected to system ground and providing a series connection thereto from the second stage emitter circuit, said power amplifier comprising at least two power transistor devices directly series coupled in each half thereof, means providing a low-impedance signal output circuit connected in common with said series coupled devices for receiving output signals therefrom in push-pull relation, means connected with a first of said transistor devices in each series for operation as a linearly controlled common-emitter amplifier to drive a second of said transistor devices in each series as a common-base amplifier and into current saturation in advance of said first transistor devices for increased power output, means providing a series-resistance biasing network for each half of the amplifier connected for applying operational base voltages to said devices therein, and voltage stabilizing and control means in each network including a control diode serially therein and a control capacitor in shunt relation to a portion thereof, whereby the voltage distribution along each network varies in response to variations in applied signal amplitude, said network being adjusted whereby the second transistor in each half of the amplifier goes into saturation in advance of the associated first transistor and whereby in each half of the amplifier the first transistor is effective to deliver a given power to the load and the second transistor delivers substantially more power thereto than the first transistor.

9. In a signal amplifier system, the combination of a transistor driver stage connected for base-input common-emitter operation and having emitter circuit resistor means of relatively low resistance connected to common ground for said system, a single-ended push-pull power amplifier stage comprising at least two power transistor devices in each half thereof and having a common high signal potential output conductor, a low-impedance signal output device for said amplifier system connected between said output conductor and common ground for said system through said driver stage emitter circuit resistor means for current feedback thereto, means providing circuit connections series coupling said transistor devices in each half of the power amplifier between said common output conductor and system ground, operating current supply means connected in series in each of said connections to ground, driver transformer coupling means connected between said stages for applying an input signal from the driver stage to a first of said power transistor devices in each half of the power amplifier stage for operation in a common-emitter mode and thereby to drive the second of said power transistor devices in each half of the power amplifier stage through the series coupling circuit in a common-base mode, means providing additional voltage feedback coupling from said common output conductor to the emitter circuit of the driver stage, means providing a series-resistor biasing network for said power transistor devices in each half of the power amplifier connected for applying base operating voltages thereto, and voltage stabilizing diode and capacitor means connected in each biasing network for effecting in each half of the power amplifier thermal stabilization of the first transistor device thereof and for controlling the voltage distribution along said network to drive the second and the first power transistor devices thereof successively into saturation for maximum power output to said load circuit in response to high-amplitude applied signals.

10. In a signal amplifier system, the combination as defined in claim 9, wherein first and second amplifier stages are provided to precede the driver stage in cascade-coupled relation therewith and having a diode-stabilized emitter circuit in the first stage and an emitter circuit in the second stage feedback-coupled to the first stage, and wherein the emitter circuit of the second stage is bootstrap connected to the emitter circuit means of the driver stage to reduce the signal loading on and distortion in the second stage.

11. In a signal amplifier system, the combination as defined in claim 9, wherein the driver transformer coupling means includes a coupling transformer having five windings in pentafilar relation on an insulating bobbin, three of which windings are series connected to provide a primary winding for connection to the driver stage and two of which windings each provide one secondary winding connected for driving the first power transistor of each half of the power amplifier stage.

12. A transistorized signal amplifier comprising first and second direct-coupled amplifier stages connected to operate in the common-emitter mode with a diode-stabilized emitter circuit in the first stage and an emitter circuit in the second stage feedback-coupled to the first stage, a driver stage coupled to said second stage for operation in the common emitter mode and having an emitter circuit including emitter resistor means connected to system ground and providing a series bootstrap connection thereto from the second stage emitter circuit, a power amplifier output stage coupled to said driver stage having at least two series-coupled transistor power amplifier devices, biasing means for said power amplifier stage, and a common signal output load circuit connected in series coupling relation with said power transistor devices and the driver stage emitter circuit for current and voltage feedback thereto.

13. A signal amplifier comprising in combination, a first and second transistor devices each having a base, an emitter and a collector electrode, means providing an output load circuit for said amplifier, a source of operating current for said amplifier, means for connecting the collector electrode of said first transistor device to the emitter electrode of said second transistor device to provide a direct current and signal transfer path so that the current flow through said transistor devices increases and decreases in unison, means connecting said output load circuit, said source of operating current and said first and second transistor devices in series, means for applying an input signal between the base and emitter of said first transistor device, biasing means for said second transistor device including a voltage-stabilizing capacitive element, and means connecting the base of said second transistor to said biasing means at a point removed from said voltage stabilizing capacitive element.

14. A signal amplifier comprising, first and second transistors each including a base, emitter and collector, operating potential supply means, output circuit means, said first and second transistors and said output circuit means connected in series across said supply means, the collector electrode of said first transistor being directly connected to the emitter electrode of said second transistor so that increases in collector current of said first transistor causes increases in collector current of said second transistor, a signal input circuit coupled bewteen the emitter and the base of said first transistor, and means providing a biasing voltage network connected to the base electrode of said second transistor and including a capacitor connected in shunt with at least a portion of said network to be charged to a voltage sufficient to permit base currents in said second transistor of a value for causing said second transistor to saturate.

15. A power amplifier output stage comprising in combination:

a pair of transistor devices each including base, emitter and collector electrodes, a load impedance element, a source of operating potential, means connecting said load impedance element and said source of operating potential in series between the emitter of the first transistor device and the collector of the second transistor device, means connecting the collector of the first transistor device for direct current and signal current flow to the emitter of the second transistor device so that increases in collector current of said first transistor device causes increases in collector current of said second transistor device, a signal input circuit and a tempertaure responsive impedance element connected in series in the order named between the base and emitter electrodes of said first device, first resistance means and a capacitor connected in the order named between the collector of said second device and the emitter of said first device, second resistance means connected between the junction of said input circuit and said temperature responsive impedance element and said first resistance means, and means connecting the base electrode of said second deivce to a point on said first resistance means.

16. A power amplifier output stage comprising in combination:

a pair of transistor devices each including base, emitter and collector electrodes, a load impedance element connected between the emitter electrode of said first device and a point of reference potential, a source of operating potential connected between the collector electrode of said second device and a point of reference potential, means connecting the collector electrode of the first transistor device for direct current and signal current flow to the emitter electrode of the second transistor device so that increases in collector current of said first transistor device causes increases in collector current of said second transistor device, a signal input circuit connected between the base and emitter electrodes of said first device, bias circuit means including a resistor and a capacitor connected between the collector electrode of said second device and the emitter electrode of said first device, means connecting the base electrode of said second device to said resistor, and means for biasing the base-emitter circuit of said first transistor device to stabilize the operating point thereof with changes in temperature.

17. A transistor amplifier comprising in combination:

a junction transistor device having base, emitter and collector electrodes;

means for providing a source of operating potential;

means for providing a pair of output terminals for connection to a load impedance element;

means connecting the emitter-collector current path of said transistor and said pair of output terminals for connection to said load impedance element in series with said source of operating potential;

an input circuit including an inductive winding;

a temperature compensating diode;

means connecting said inductive winding and temperature compensating diode in the order named between said base and emitter electrodes;

resistive means connected between said collector electrode and the junction between the diode and said inductive winding, said diode being poled to be forward biased by the potential applied thereto through said resistive means; and a stabilizing capacitor connected between a point on said resistive means and the terminal of said diode remote from said inductive winding.

18. A push-pull transistor amplifier circuit comprising in combination:

a first and second junction transistor device each having a base, emitter and collector electrode;

means for providing a source of operating potential providing a positive terminal, a negative terminal, and an intermediate terminal of reference potential;

means providing a first and second output terminal for connection to a load impedance element;

means connecting said first output terminal to the intermediate terminal of said source of operating potential;

means for coupling said second output terminal in common to the emitter of said first transistor and to the collector of said second transistor;

means connecting the collector of said first transistor to one of said positive and negative terminals of said source of operating potential, means for connecting the emitter electrode of said second transistor to the other of said positive and negative terminals of said source of operating potential;

means providing an input circuit including first and second inductive winding portions;

first and second temperature compensating diodes;

means connecting said first inductive winding portion and said first temperature compensating diode in the order named between the base and emitter electrodes of said first transistor device;

means connecting said second inductive winding portion and said second temperature compensating diode in the order named between the base and emitter electrodes of said second transistor device;

first resistive means connected between the collector electrode of said first transistor device and the junction between said first diode and said first inductive winding portion, said first diode being poled to be forward biased by the potential applied thereto through said first resistive means;

second resistive means connected between the collector electrode and said second transistor device and the junction between said second diode and said second inductive winding portion, said second diode being poled to be forward biased by the potential applied thereto through said second resistive means;

a first stabilizing capacitor connected between a point on said first resistive means and the terminal of said first diode remote from said first inductive winding portion; and a second stabilizing capacitor connected between a point on said second resistive means and the terminal of said second diode remote from said second inductive winding portion.

19. A push-pull transistor amplifier comprising:

means providing an operating potential supply having a pair of terminals;

first, second, third and fourth transistors, each including base emitter and collector electrodes, means connecting said transistors in series in the order named between the terminals of said operating potential supply with the collector electrodes of the first, second and third transistors respectively connected to the emitter electrode of the second, third and fourth transistors;

output circuit means adapted to be coupled between the junction of said second and third transistors and said operating potential supply;

a first voltage divider network connected between the collector electrode of the fourth transistor and the junction between said second and third transistors, the base electrode of said fourth transistor being connected to a first point on said first voltage divider network;

a first capacitor connected between a second point on said first voltage divider network further removed from said fourth transistor collector than said first point and the junction between said second and third transistors;

a first signal input circuit connected between the base electrode of said third transistor and a third point on said first voltage divider network further removed from said fourth transistor collector electrode than said second point;

a second voltage divider network connected between the junction of said second and third transistor and the emitter electrode of said first transistor, the base electrode of said second transistor being connected to a first point on said second voltage divider network;

a second capacitor connected between the emitter electrode of said first transistor and a second point on said second voltage divider network further removed from said junction between said second and third transistors than said first point, and a second signal input circuit connected between the base electrode of said first transistor and a third point on said second voltage divider network further removed from junction between said second and third transistors than said second point.

20. A push-pull transistor amplifier circuit comprising in combination:

a first and second transistor devices each having base, emitter and collector electrodes;

means for providing a source of operating potential having a plurality of terminals;

means providing a first and second output terminal for connection to a load impedance element;

means connecting said first output terminal to one of said plurality of terminals of said source of operating potential;

means for coupling said second output terminal in common to the emitter of said first transistor and to the collector of said second transistor;

means connecting the collector of said first transistor to one of said plurality of terminals of said source of operating potential, means for connecting the emitter electrode of said second transistor to another of said plurality of terminals of said source of operating potential;

means providing an input circuit including first and second inductive winding portions;

first and second temperature compensating diodes;

means connecting said first inductive winding portion and said first temperature compensating diode in the order named between the base and emitter electrodes of said first transistor device;

means connecting said second inductive winding portion and said second temperature compensating diode in the order named between the base and emitter electrodes of said second transistor device;

first resistive means connected between the collector electrode of said first transistor device and the junction between said first diode and said first inductive winding portion, said first diode being poled to be forward biased by the potential applied thereto through said first resistive means;

second resistive means connected between the collector electrode of said second transistor device and the junction between said second diode and said second inductive winding portion, said second diode being poled to be forward biased by the potential applied thereto through said resistive means;

a first stabilizing capacitor connected between a point on said first resistive means and the terminal of said first diode remote from said first inductive winding portion; and a second stabilizing capacitor connected between a point on said second resistive means and the terminal of said second diode remote from said second inductive winding portion.

References Cited by the Examiner

UNITED STATES PATENTS

| | | | |
|---|---|---|---|
| 2,784,262 | 2/1957 | Crow | 330—14 |
| 2,926,307 | 2/1960 | Ehret | 330—18 |
| 2,951,208 | 8/1960 | Barton | 330—22 X |
| 3,001,144 | 9/1961 | Dandl | 330—18 X |
| 3,005,958 | 10/1961 | Grant | 330—22 X |

OTHER REFERENCES

Herscher: Designing Transistor A-F Power Amplifiers, April 11, 1958, Electronics, pages 96–99, FIGURE 2.

Hakimoglu: Multivibrator Power Supply, April 1960, IBM Disclosure Bulletin, vol. 2, No. 6.

ROY LAKE, *Primary Examiner.*

ARTHUR GAUSS, NATHAN KAUFMAN, *Examiners.*